United States Patent
Ruat et al.

(10) Patent No.: US 7,078,952 B2
(45) Date of Patent: Jul. 18, 2006

(54) DEVICE FOR CALIBRATING A CLOCK SIGNAL

(75) Inventors: Ludovic Ruat, Savourin (FR); Paul Kinowski, Aix-en-Provence (FR); Alexander Czajor, Bouc Bel Air (FR)

(73) Assignee: STMicroelectronics S.A., Montrouge (FR)

( * ) Notice: Subject to any disclaimer, the term of this patent is extended or adjusted under 35 U.S.C. 154(b) by 99 days.

(21) Appl. No.: 10/839,978

(22) Filed: May 6, 2004

(65) Prior Publication Data

US 2005/0024111 A1 Feb. 3, 2005

Related U.S. Application Data

(63) Continuation of application No. PCT/FR02/03781, filed on Nov. 5, 2002.

(30) Foreign Application Priority Data

Nov. 6, 2001 (FR) .................................. 01 14300

(51) Int. Cl.
   *G06F 1/04* (2006.01)
   *H03K 3/00* (2006.01)

(52) U.S. Cl. ...................................... 327/291; 327/293

(58) Field of Classification Search ..................... None
   See application file for complete search history.

(56) References Cited

U.S. PATENT DOCUMENTS

| | | | |
|---|---|---|---|
| 4,667,328 A | 5/1987 | Imran | ........................... 371/61 |
| 4,714,899 A * | 12/1987 | Kurtzman et al. | ........... 331/1 A |
| 4,931,748 A | 6/1990 | McDermott et al. | ......... 331/1 A |
| 5,257,294 A * | 10/1993 | Pinto et al. | .................. 375/376 |
| 5,485,127 A * | 1/1996 | Bertoluzzi et al. | ............. 331/69 |
| 6,236,277 B1 | 5/2001 | Esker | ........................... 331/14 |
| 6,337,600 B1 * | 1/2002 | Shigemori et al. | ............. 331/16 |

FOREIGN PATENT DOCUMENTS

EP   1 134 921 A2   9/2001

* cited by examiner

*Primary Examiner*—Tuan T. Lam
(74) *Attorney, Agent, or Firm*—Lisa K. Jorgenson; E. Russell Tarleton; Seed IP Law Group PLLC

(57) ABSTRACT

An integrated circuit having a clock calibration device receiving a local clock signal from an oscillator and applying a correction value to the signal to produce a corrected clock signal. The clock calibration device includes a frequency dividing module having a programmable divider and a calibration register for storing the correction value, the programmable divider receiving the local clock signal and delivering the corrected clock signal, and a circuit for determining a new correction value using an external reference signal. A time base unit produces a time base signal using a timing signal derived from the local clock signal, and it includes a counting module coupled to a load register wherein a load value is stored that determines the ratio between the frequency of the time base signal and that of the timing signal. An external computing unit loads a new load value into the load register by using the new correction value stored in the calibration register to deduce the new load value therefrom.

20 Claims, 3 Drawing Sheets

DEVICE FOR CALIBRATING A CLOCK SIGNAL

BACKGROUND OF THE INVENTION

1. Field of the Invention

The present invention relates to a calibration device for improving the precision of a clock signal, particularly for electronic circuits connected to an interconnect network to which they send a send signal and by which they receive a receive signal, and, more particularly microcontrollers that are clocked by a clock signal.

2. Description of the Related Art

A microcontroller is an integrated circuit that comprises an oscillator for producing the clock signal, a processor, a program memory, a data memory, and peripherals, including in particular a generator for generating interrupts of the processor.

A quartz oscillator is widely used as a result of the very high precision of the frequency of the clock signal it produces. However, this oscillator is costly and has relatively high power consumption, such that it is not suitable for certain applications, particularly in the automotive field.

For these applications, a cheaper component that consumes less power is therefore preferred, such as an oscillator that uses a resonant circuit formed by a resistor and a capacitor, the tuning frequency of this resonant circuit determining the frequency of the clock signal. This type of oscillator, which is well known by those skilled in the art, is traditionally called an RC oscillator, with reference to the initials of the components of the resonant circuit. Ring oscillators, among others, which can also be suitable for these applications, are also known.

The frequency of the clock signal delivered by these oscillators is considerably imprecise mainly due to the dispersion of the characteristics during the manufacturing, although this frequency does not drift substantially in time. While this imprecision can be tolerated by the processor, this is not the case for certain applications.

Most of the control applications in motorcars, such as windscreen wiper control or door module control, are synchronized over a time base. This time base is delivered by a counting module ("TIMER") dividing the local clock signal. This counting module periodically generates interrupts. Upon each interrupt, a state machine evaluates the value of its inputs and calculates the following state of its outputs. The advantage of this state machine is its determinism which, to be able to be guaranteed, requires a precise time base.

BRIEF SUMMARY OF THE INVENTION

The disclosed embodiments of the present invention provide a low cost oscillator to be used without degrading the precision of the time base of the application.

In one embodiment of the present invention an integrated circuit is provided that includes a clock calibration device receiving a local clock signal from an oscillator and applying a correction value to the signal to produce a corrected clock signal, the clock calibration device including a frequency dividing module having a programmable divider and a calibration register for storing the correction value, the programmable divider receiving the local clock signal and delivering the corrected clock signal, and means for determining a new correction value using an external reference signal. The integrated circuit further includes a time base unit for producing a time base signal using a timing signal derived from the local clock signal, the time base unit formed of a counting module allocated a load register wherein a load value is saved, which determines the ratio between the frequency of the time base signal and that of the timing signal; and a computing unit external to the clock calibration device for loading a new load value into the load register by using the new correction value stored in the calibration register of the clock calibration device, to deduce the new load value to be loaded into the load register therefrom.

According to one embodiment, the means for determining a new correction value using the external reference signal include measuring means for evaluating the frequency of the external reference signal by using the corrected clock signal as a time base, and a control unit for determining the new correction value using the frequency evaluation performed by the measuring means.

According to one embodiment, the external reference signal results from a receive signal coming from an interconnect network to which the integrated circuit is connected.

According to one embodiment, the external reference signal is formed by a series of bits alternately taking the value 0 and 1.

According to one embodiment, the measuring means evaluate the duration of a predetermined even number of bits of the external reference signal.

According to one embodiment, a pair of consecutive bits is delimited by two consecutive edges of the same nature of the external reference signal.

According to one embodiment, the oscillator is an RC oscillator.

According to one embodiment, the oscillator is a ring oscillator.

According to one embodiment, the new load value is a predetermined function of the correction value.

The present invention also relates to a method for calibrating, in an integrated circuit, a time base unit provided for producing a time base signal using a timing signal derived from a local clock signal, the integrated circuit having a clock calibration device receiving the local clock signal from an oscillator and applying a correction value to the signal to produce a corrected clock signal. The clock calibration device includes a frequency dividing module having a programmable divider and a calibration register for storing the correction value, the programmable divider receiving the local clock signal and delivering the corrected clock signal. The time base unit includes a counting module allocated to a load register wherein a load value is saved that determines the ratio between the frequency of the time base signal and that of the timing signal. The method includes a step of determining, by the clock calibration device, a new correction value using an external reference signal, and a step of loading a new load value into the load register, the new load value determined by using the new correction value stored in the calibration register.

According to one embodiment, the new correction value is determined using an external reference signal by measuring the frequency of the external reference signal, the measurement being performed by using the corrected clock signal as a time base, the new correction value determined by using the evaluation of the frequency of the external reference signal.

According to one embodiment, the external reference signal results from a receive signal coming from an interconnect network to which the integrated circuit is connected.

According to one embodiment, the external reference signal is formed by a series of bits alternately taking the value 0 and 1.

According to one embodiment, the new load value is a predetermined function of the correction value.

According to one embodiment, the oscillator of the integrated circuit is an RC oscillator.

According to one embodiment, the oscillator of the integrated circuit is a ring oscillator.

According to another embodiment of the invention, a clock calibration circuit is provided that includes a clock calibrating circuit having a frequency divider module having a calibration register for holding a correction value and a programmable divider circuit for generating a calibrated clock signal; a correction value circuit configured to receive a time base signal and to generate a correction value and a load value; and a time base circuit configured to receive a timing signal and to receive the load value from the correction value circuit, and to generate the time base signal in response thereto.

According to another embodiment of the invention, a clock calibration circuit is provided that includes a clock calibration circuit having a frequency divider module with a calibration register configured to receive a correction value and a programmable divider circuit configured to receive the correction value from the calibration register and an external clock signal; and a correction value circuit configured to receive a time base signal and to generate the correction value signal for the calibration register and to generate a load value; and a measuring circuit configured to generate a timing signal; and a time base circuit configured to receive the timing signal and the load value and to generate in response thereto the time base signal.

In accordance with another embodiment of the invention an integrated circuit is provided that includes an oscillator circuit configured to generate a clock signal; a clock calibration device having a frequency divider module comprising a calibration register configured to store a correction value and a programmable divider circuit configured to receive the clock signal from the oscillator and to generate a corrected clock signal; a correction value circuit configured to receive a time base signal and to generate a load value and the correction value; a measuring circuit configured to generate a timing signal; and a time base circuit configured to receive the timing signal and the load value and to generate the time base signal in response thereto.

BRIEF DESCRIPTION OF THE SEVERAL VIEWS OF THE DRAWINGS

These and other features and advantages of the present invention will be explained in greater detail in the following description of an example of an embodiment of a calibration device, given in relation with, but not limited to, the following figures.

DETAILED DESCRIPTION OF THE INVENTION

The elements present in the various figures are allocated a single reference.

Figure 1:
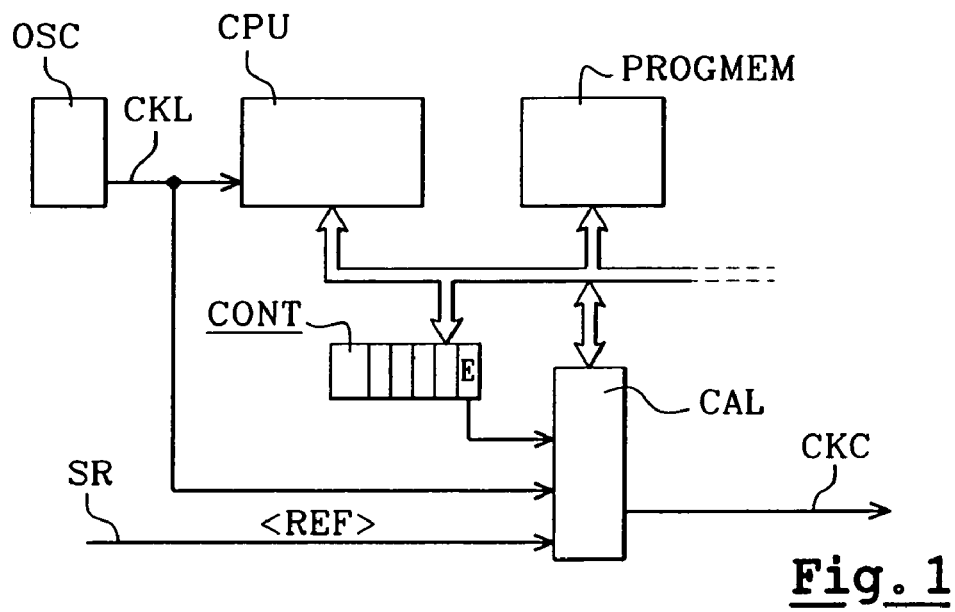
FIG. 1 is a schematic diagram of an integrated circuit comprising a calibration device according to the present invention.

FIG. 1 schematically represents an integrated circuit comprising an oscillator OSC delivering a local clock signal CKL to a microcontroller processor CPU equipped with a program memory PROGMEM.

A calibration device CAL according to the present invention receives this local clock signal CKL and delivers a corrected clock signal CKC to certain peripherals. The local signal is corrected by means of a reference signal REF which is characterized by a frequency of high precision, sufficient, in any case, for the application considered. This reference signal is produced outside the circuit.

The calibration device CAL is periodically activated by an external control unit such as the processor CPU, by means of a validation bit E present in a control register CONT accessible by the bus of the microcontroller.

Figure 2:
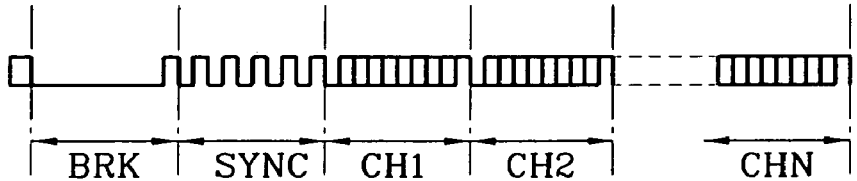
FIG. 2 represents a special receive signal, i.e. an asynchronous frame according to the LIN protocol.

As an example, the reference signal is derived from the receive signal SR that the microcontroller receives from an interconnect network (not represented). As shown in FIG. 2, the receive signal SR takes for example the shape of an asynchronous frame according to the LIN protocol ("Local Interconnect Network"). This frame first of all comprises an interrupt character BRK having a determined number of bits set to 0 and a last bit equal to 1 ("extra bit"), then a synchronization character SYNC, and then data characters CH1, CH2 . . . CHN. The character CH1 is used as an identification field to allow for multipoint links by means of the interconnect network between a master device and slave devices, which include the circuit of the present invention.

Figure 3:
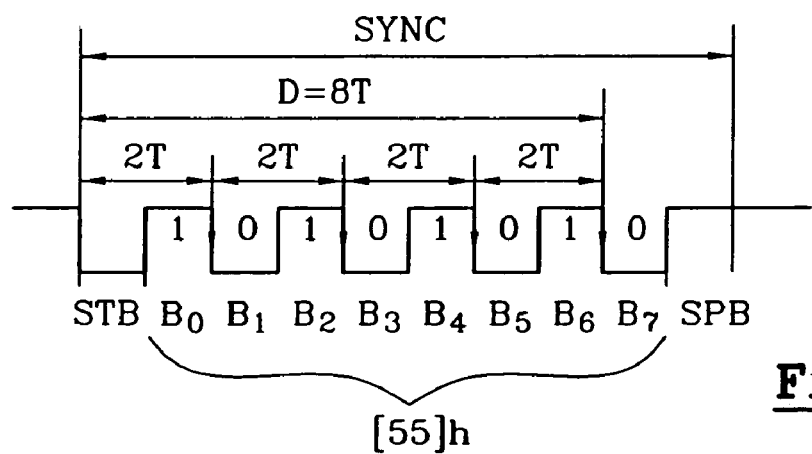
FIG. 3 represents a special reference signal, i.e. a synchronization character.

The character SYNC, represented in greater detail in FIG. 3, is equal to [55]h in hexadecimal notation, i.e. the character "10101010" in binary form (bits B0 to B7). As this synchronization character is preceded by a start bit STB on 0 and followed by a stop bit on 1, it has five falling edges in total. This is the character that is used as a reference signal. As the duration passing between the five falling edges is equal to 8 times the period T of the reference signal, the measurement of this duration enables the reference period T to be deduced therefrom and the period of the corrected clock signal CKC to be adjusted thereto.

The identification of the synchronization character SYNC presupposes the prior detection of the interrupt character BRK.

Figure 4:
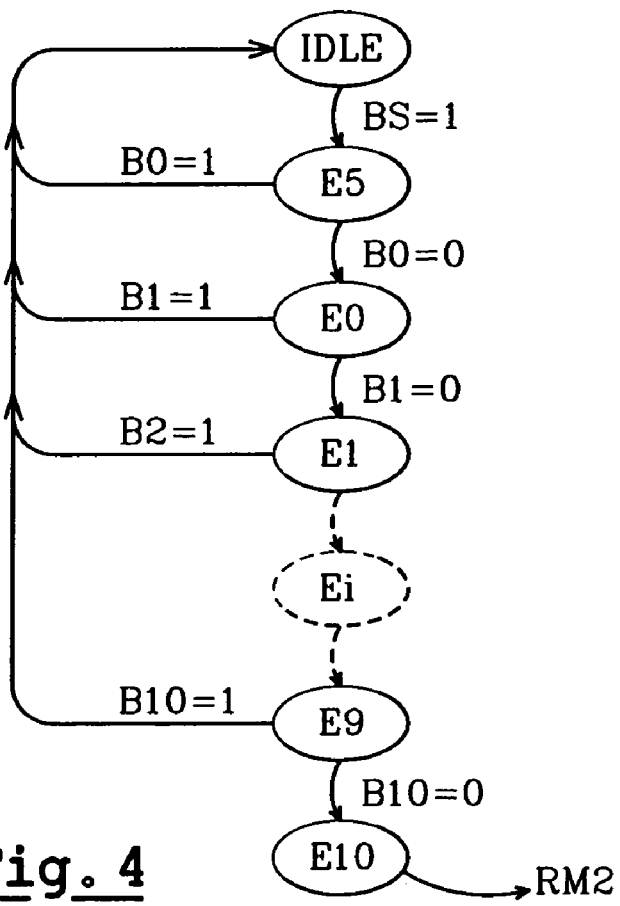
FIG. 4 represents a unit for detecting an interrupt character.

As shown in FIG. 4, the receiver includes for example, a unit for detecting the interrupt character BRK, which takes the shape of a state machine.

Receiving a bit BS on 0 triggers the change from the wait state IDLE to the start bit state ES. Receiving the following bit B0 depending on whether it is equal to 0, respectively 1, causes the change to the "first bit" state E0, respectively to the wait state IDLE. From the first bit state E0, receiving the second bit B1 following the start bit BS, depending on whether it is equal to 0, respectively 1, initiates the change to the "second bit" state E1, respectively to the wait state IDLE. By generalizing, receiving the (i+1)th bit following the start bit BS in the ith bit state Ei, depending on whether it is equal to 0, respectively 1, leads to the change to the "(i+1)ith bit" state, respectively to the wait state.

As soon as the index i is equal to 9, receiving the eleventh bit B10 following the start bit BS, depending on whether it is equal to 0, respectively 1, determines the change to the "eleventh bit" state E10, respectively to the wait state. The "eleventh bit" state E10 produces an interrupt instruction RM2.

The interrupt character BRK can naturally be detected in any other way, for example by means of an 11-bit shift register all the positions of which undergo an AND operation.

As soon as the interrupt character BRK has been detected, the reference signal REF is available.

Figure 5:
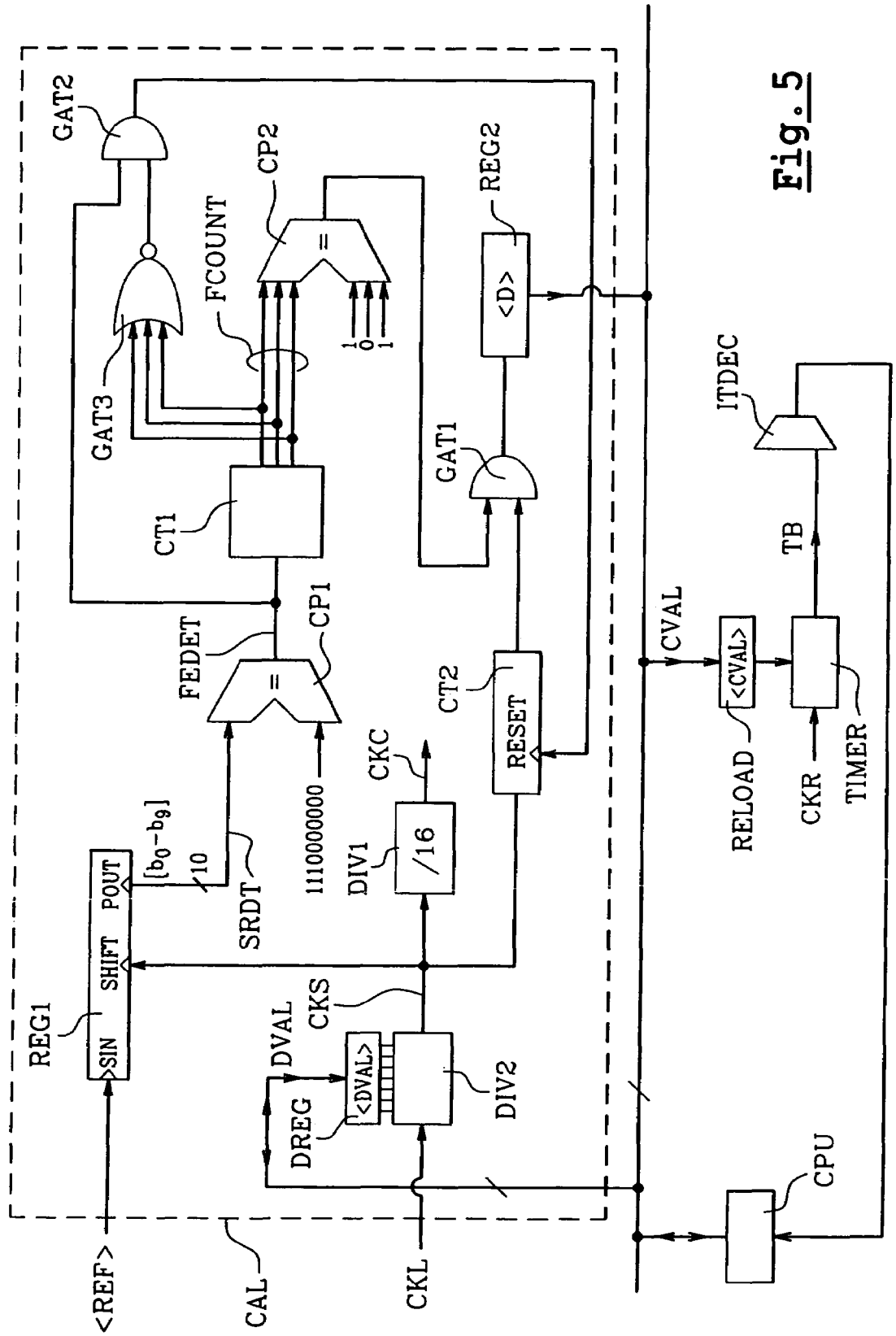
FIG. 5 is the diagram of a calibration device according to the present invention and of a counting module according to the present invention, and FIG. 6 schematically represents a microcontroller to which the present invention is applied.

With reference to FIG. 5, the calibration device CAL tunes the frequency of the corrected clock signal CKC to that of the reference signal REF by means of a dividing module that comprises two frequency dividers.

The corrected clock signal CKC is delivered by a first divider DIV1, here a divider by 16, receiving a strobe CKS at input. The strobe CKS is itself delivered by a second programmable divider DIV2 receiving at input the local clock signal CKL coming from the oscillator OSC. The ratio between the frequency of the clock signal CKL and that of the strobe CKS is determined by a correction value DVAL loaded into a calibration register DREG of the second divider DIV2.

The calibration device CAL further comprises a receive register REG1, a send register REG2, a first CT1 and a second CT2 counter, a first CP1 and a second CP2 logic comparator, a first GAT1 and a second GAT2 "AND" gate, and a third GAT3 "NOR" gate.

The receive register REG1 is a 10-bit shift register having a shift input SHIFT clocked by the strobe CKS. It receives the reference signal REF at a serial input SIN. It delivers sampled data SRDT (bits b0 to b9) to a parallel output POUT.

The sampled data SRDT are applied to an input of the first comparator CP1 the other input of which receives a reference number "1110000000", forming a falling edge detection criterion. The comparator CP1 delivers a presence signal FEDET that is applied to the input of the first counter CT1.

The first counter CT1 delivers on 3 bits a signal FCOUNT for counting falling edges that is applied to an input of the second comparator CP2, the other input of which receives in binary form a reference number equal to 5 ("101") and the output of which is connected to a first input of the first gate GAT1.

The second counter CT2 counts the pulses of the strobe CKS, and has a reset input RESET that is linked to the output of the second gate GAT2.

The second gate GAT2 receives the presence signal FEDET at a first input and, at a second input, the output signal of the third gate GAT3 that receives at its inputs the three bits of the signal for counting falling edges FCOUNT. The output signal of the third gate GAT3 is therefore equal to 1 if and only if the signal for counting falling edges FCOUNT is equal to 0.

The first gate GAT1 has its second input linked to the output of the second counter CT2 and its output is linked to the send register REG2 that stores the number D of pulses of the strobe CKS that have occurred between five consecutive falling edges of the reference signal REF.

Using the value D updated in the register REG2, a computing unit determines the value DVAL to be loaded into the calibration register DREG. This computing unit can be a specific computing circuit provided in the calibration device CAL or an external computing unit, such as the processor CPU of the microcontroller for example, which is, in this case, linked to the register DREG by the data bus of the microcontroller.

By designating:
TL the period of the local clock signal CKL,
TC the period of the corrected clock signal CKC,
TR the period of the reference signal REF,
DPRE the value that was previously stored in the calibration register DREG,
DVAL the new value that is to be loaded into the calibration register DREG,
PER the counting duration corresponding to the time interval separating five falling edges of the reference signal REF,
the following can thus be written:

$$TL=TC/(16*DPRE)=TR/(16*DVAL)$$

$$DVAL=DPRE*(TR/TC) \quad (1)$$

$$PER=8*TR=(D/16)*TC$$

$$TR/TC=D/128 \quad (2)$$

By relating the equations (1) and (2), the value to be loaded into the calibration register DREG is obtained:

$$DVAL=DPRE*(D/128)$$

The new correction value DVAL is automatically loaded at the end of the measuring into the register DREG so as to enable the following data to be correctly received.

According to the present invention, the calibration device CAL also comprises a time base unit that mainly comprises a load register RELOAD and a counting module TIMER. This counting module delivers a time base signal TB the frequency of which is equal to that of a timing signal CKR divided by the value saved in the load register RELOAD. Naturally, the frequency of the timing signal CKR has a predetermined relation with that of the local clock signal CKL. For example, these frequencies are either equal or the ratio between them is known.

The time base signal is, for example, applied to an interrupt generator ITDEC for detecting events according to the time base TB. The latter is retimed in a way described below, in response to the technical problem set out in the preamble.

The new value DVAL of the calibration register DREG is used by an external computing unit, such as the CPU of the microcontroller for example, to calculate a new value CVAL to be loaded into the load register RELOAD.

By designating by:
CVAL the new value to be loaded into the load register RELOAD,
DVAL the new value saved in the calibration register DREG,
DNOM the value of the calibration register DREG for a nominal value of the local clock signal CKL,
CNOM the value of the load register RELOAD for the value DNOM of the calibration register DREG so as to obtain the nominal time base signal,
the following can thus be written:

$$CVAL=CNOM*DVAL/DNOM$$

The time base signal TB is therefore advantageously retimed using the clock retiming value DVAL determined by the calibration device.

Figure 6:
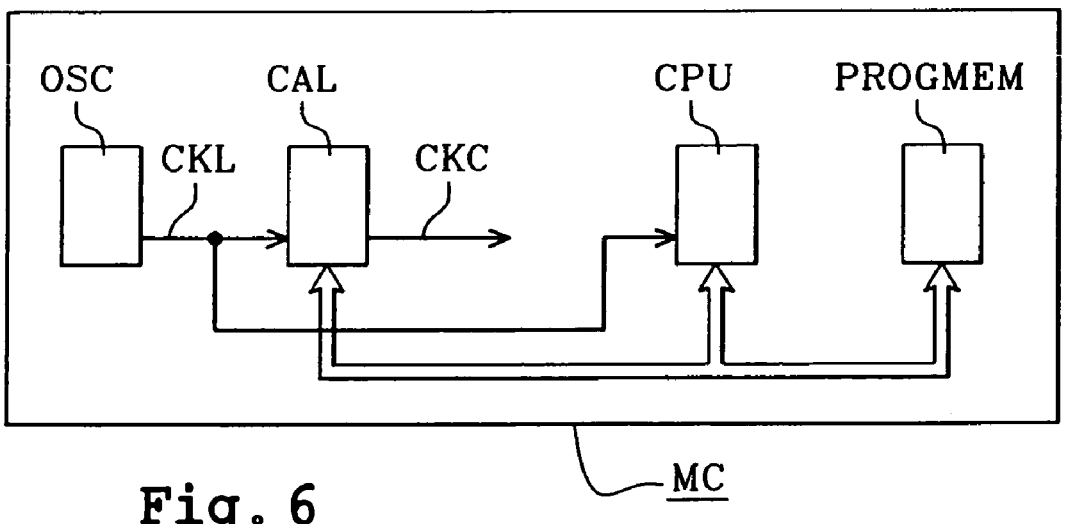

FIG. 6 shows an example of implementation of the present invention and schematically represents a microcontroller MC comprising the processor CPU, the program memory PROGMEM and the calibration device CAL on a same silicon chip. It is also possible for the oscillator OSC to be implanted on this chip.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

It will be understood by those skilled in the art that various alternatives and applications of the present invention may be made. The example of embodiment of the present invention presented above has been chosen for its concrete nature and it would not be possible to give an exhaustive list of all the embodiments of the present invention here. Thus, any step or any means described can be replaced by an equivalent step or means while remaining within the scope of the present invention. Accordingly, the invention is not limited except as by the appended claims and the equivalents thereof.

The invention claimed is:

1. An integrated circuit, comprising:
   a clock calibration device receiving a local clock signal from an oscillator and applying a correction value to said signal to produce a corrected clock signal, the clock calibration device comprising:
      a frequency dividing module comprising a programmable divider and a calibration register for storing the correction value, the programmable divider receiving the local clock signal and delivering the corrected clock signal; and
      means for determining a new correction value using an external reference signal, the means comprise:
      a time base unit for producing a time base signal using a timing signal derived from the local clock signal, the time base unit comprising a counting module coupled to a load register wherein a load value is saved which determines a ratio between a frequency of the time base signal and that of the timing signal; and
      a computing unit external to the clock calibration device, for loading a new load value into the load register, by using the new correction value stored in the calibration register of the clock calibration device, to deduce the new load value to be loaded into the load register therefrom.

2. The integrated circuit of claim 1 wherein the means for determining a new correction value using the external reference signal comprise measuring means for evaluating the frequency of the external reference signal by using the corrected clock signal as a time base, and a control unit for determining the new correction value using the frequency evaluation performed by the measuring means.

3. The integrated circuit of claim 1 wherein the external reference signal results from a receive signal coming from an interconnect network to which the integrated circuit is connected.

4. The integrated circuit of claim 1 wherein the external reference signal is formed by a series of bits alternately taking the value 0 and 1.

5. The integrated circuit of claim 2 wherein the measuring means evaluate the duration of a predetermined even number of bits of the external reference signal.

6. The integrated circuit of claim 5 wherein a pair of consecutive bits is delimited by two consecutive edges of the same nature of the external reference signal.

7. The integrated circuit of claim 1 wherein the oscillator is an RC oscillator.

8. The integrated circuit of claim 1 wherein the oscillator is a ring oscillator.

9. The integrated circuit of claim 1 wherein the new load value is a predetermined function of the correction value.

10. A method for calibrating, in an integrated circuit, a time base unit provided for producing a time base signal using a timing signal derived from a local clock signal,
    the integrated circuit including a clock calibration device receiving the local clock signal from an oscillator and applying a correction value to said signal to produce a corrected clock signal, the clock calibration device having a frequency dividing module that includes a programmable divider and a calibration register for storing the correction value, the programmable divider receiving the local clock signal and delivering the corrected clock signal,
    the time base unit having a counting module coupled to a load register wherein a load value is saved that determines the ratio between the frequency of the time base signal and that of the timing signal,
    the method comprising:
       a step of determining, by the clock calibration device, a new correction value using an external reference signal; and
       a step of loading a new load value into the load register, the new load value determined using the new correction value stored in the calibration register.

11. The method according to claim 10 wherein the new correction value is determined using an external reference signal by measuring the frequency of the external reference signal, said measurement being performed by using the corrected clock signal as a time base, the new correction value determined using the evaluation of the frequency of the external reference signal.

12. The method of claim 10 wherein the external reference signal results from a receive signal coming from an interconnect network to which the integrated circuit is connected.

13. The method of claim 10 wherein the external reference signal is formed of a series of bits alternately taking the value 0 and 1.

14. The method of claim 10 wherein the new load value is a predetermined function of the correction value.

15. The method of claim 10 wherein the oscillator of the integrated circuit is an RC oscillator.

16. The method of claim 10 wherein the oscillator of the integrated circuit is a ring oscillator.

17. A clock calibration device, comprising:
    a clock calibrating circuit, comprising:
       a frequency divider module comprising a calibration register for holding a correction value and a programmable divider circuit for generating a corrected clock signal from a local clock signal;
       a correction value circuit configured to receive a time base signal and to generate a correction value and a load value;
    a time base circuit configured to receive a timing signal and to receive the load value from the correction value circuit, and to generate the time base signal in response thereto, the time base circuit including a counting module coupled to a load register that receives the load value, which determines a ratio between a frequency of the time base signal and that of the timing signal; and
    a processor external to the clock calibrating circuit for loading the load value into a load register by using the correction value of the correction value circuit to deduce the load value to be loaded into the load register.

18. The device of claim 17, comprising a measuring circuit that is configured to evaluate the duration of a predetermined even number of bits of a reference signal used in generating the timing signal.

19. The device of claim 18, wherein the measuring circuit is configured to evaluate a pair of consecutive bits by delimiting between two consecutive edges of the same nature in the reference signal.

20. The device of claim 17, wherein the programmable divider circuit is configured to receive an external clock signal generated by one of an RC oscillator and a ring oscillator.

\* \* \* \* \*